US009947088B2

(12) United States Patent
Sindo et al.

(10) Patent No.: US 9,947,088 B2
(45) Date of Patent: Apr. 17, 2018

(54) EVALUATION CONDITION SETTING METHOD OF SEMICONDUCTOR DEVICE, AND EVALUATION CONDITION SETTING APPARATUS

(71) Applicant: Hitachi High-Technologies Corporation, Minato-ku, Tokyo (JP)

(72) Inventors: Hiroyuki Sindo, Tokyo (JP); Kaoru Fukaya, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 15/215,888

(22) Filed: Jul. 21, 2016

(65) Prior Publication Data
US 2017/0032212 A1    Feb. 2, 2017

(30) Foreign Application Priority Data
Jul. 31, 2015   (JP) ................................. 2015-151452

(51) Int. Cl.
*G06F 17/50* (2006.01)
*G06T 7/00* (2017.01)
*H01J 37/22* (2006.01)

(52) U.S. Cl.
CPC .............. *G06T 7/001* (2013.01); *H01J 37/22* (2013.01); *G06T 2207/10061* (2013.01); *G06T 2207/10144* (2013.01); *G06T 2207/20021* (2013.01); *G06T 2207/30148* (2013.01); *H01J 2237/2806* (2013.01)

(58) Field of Classification Search
CPC ........................................................ G06F 17/50
USPC ............................................................. 716/54
See application file for complete search history.

(56) References Cited

U.S. PATENT DOCUMENTS

| 7,685,560 B2 | 3/2010 | Nagatomo et al. |
| 2015/0012243 A1 | 1/2015 | Honda et al. |
| 2015/0308966 A1* | 10/2015 | Grootjans ........ G01N 21/95607 |
| | | 355/67 |

FOREIGN PATENT DOCUMENTS

| JP | 2005-286095 A | 10/2005 |
| JP | 2013-179105 A | 9/2013 |

* cited by examiner

*Primary Examiner* — Thuan Do
(74) *Attorney, Agent, or Firm* — Crowell & Moring LLP

(57) ABSTRACT

An object of the present invention is to provide an evaluation condition setting method and an evaluation condition setting apparatus of a semiconductor device which can select an appropriate evaluation pattern for exposure condition management with high accuracy. In order to solve the object, the present invention proposes an evaluation condition setting method or an evaluation condition setting apparatus which excludes a pattern corresponding to a process window chart defining a process window range smaller than a predetermined process window range from a measurement target, in a plurality of the process window charts which are obtained based on scanning of a charged particle beam with respect to another pattern formed on a sample.

7 Claims, 9 Drawing Sheets

[Fig. 1]
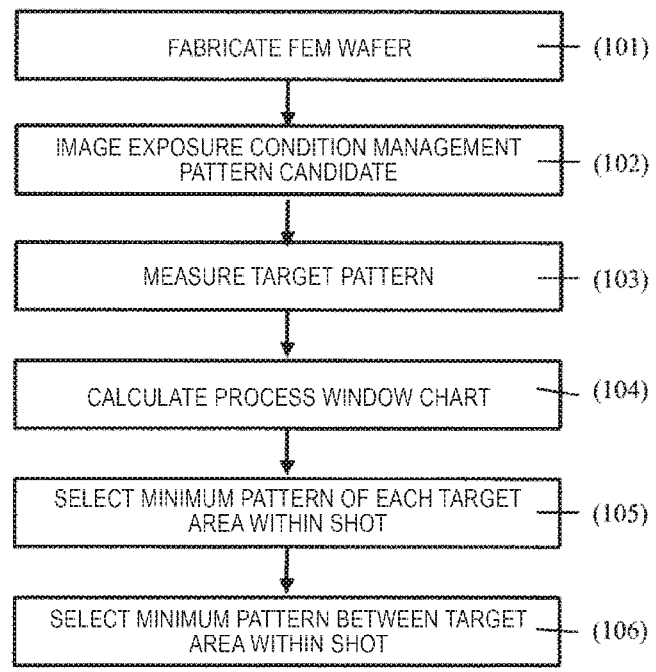

[Fig. 2]
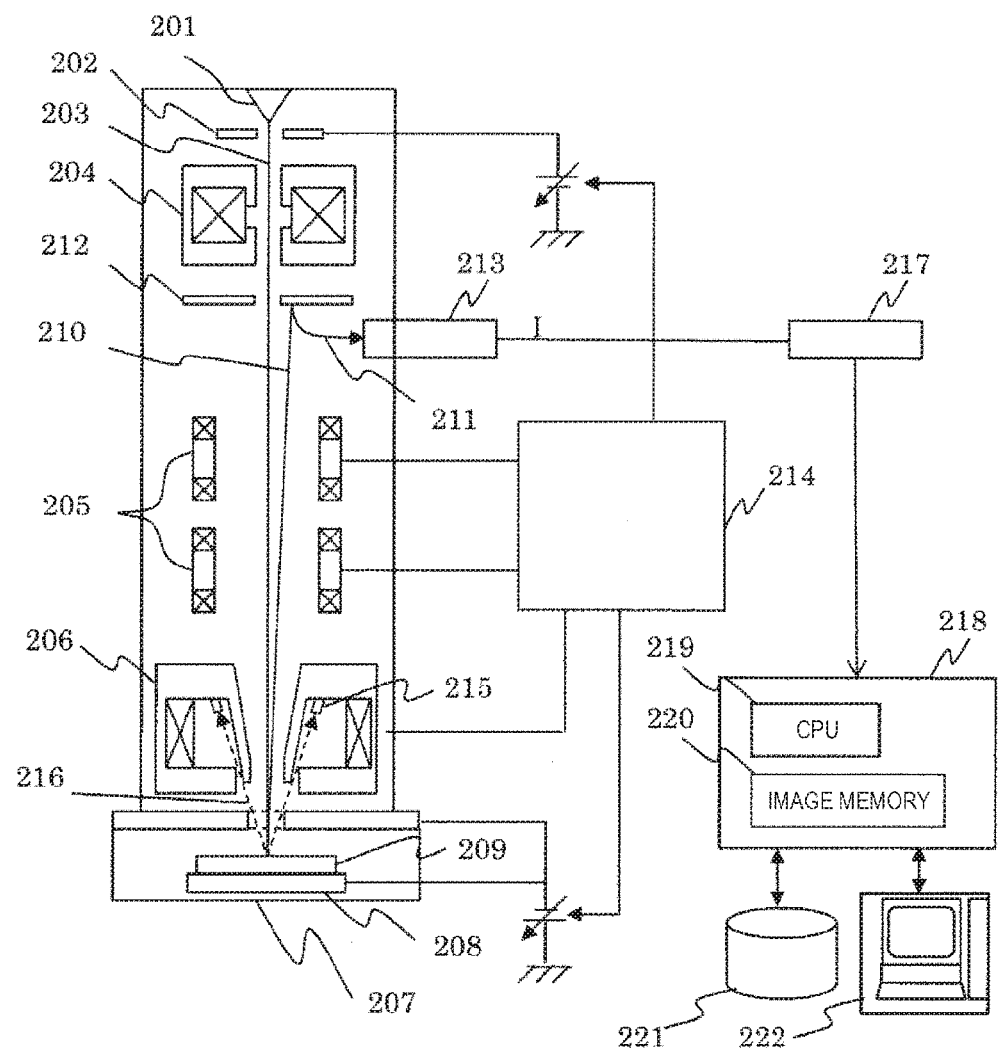

[Fig. 3]
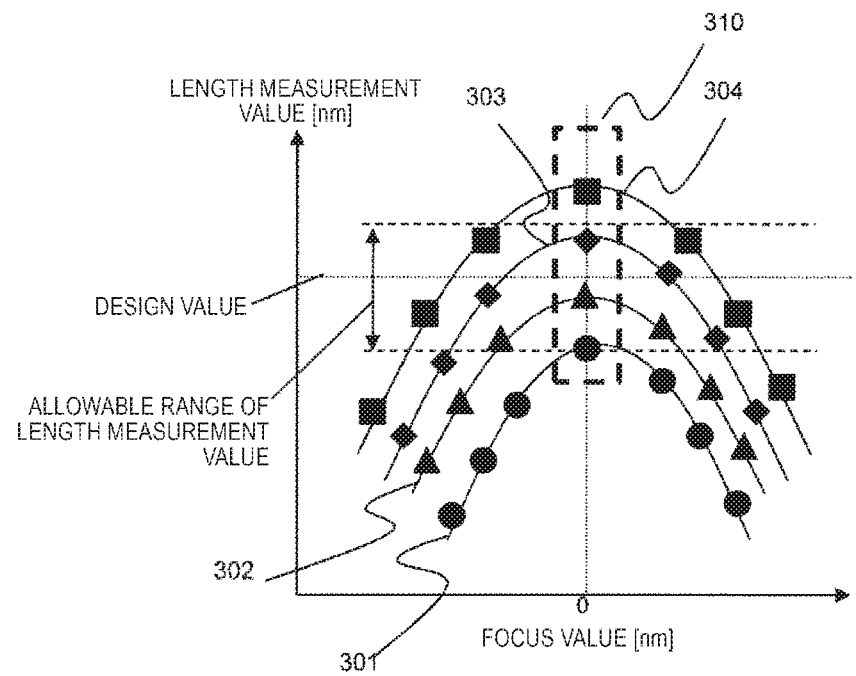
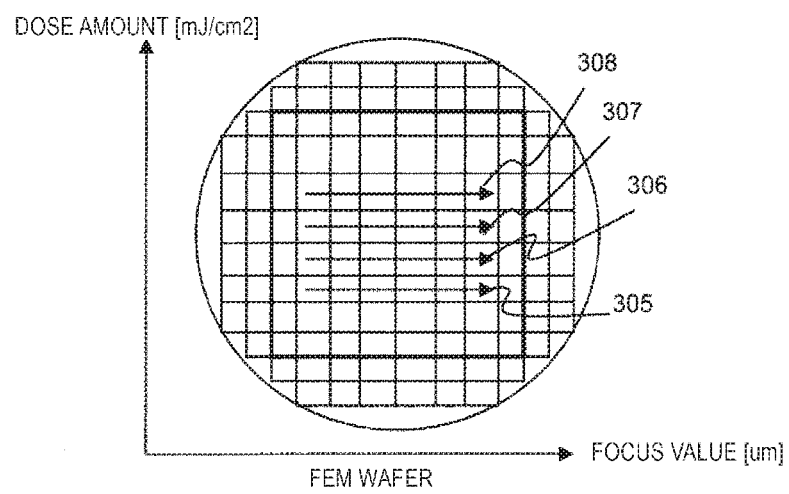

[Fig. 4]
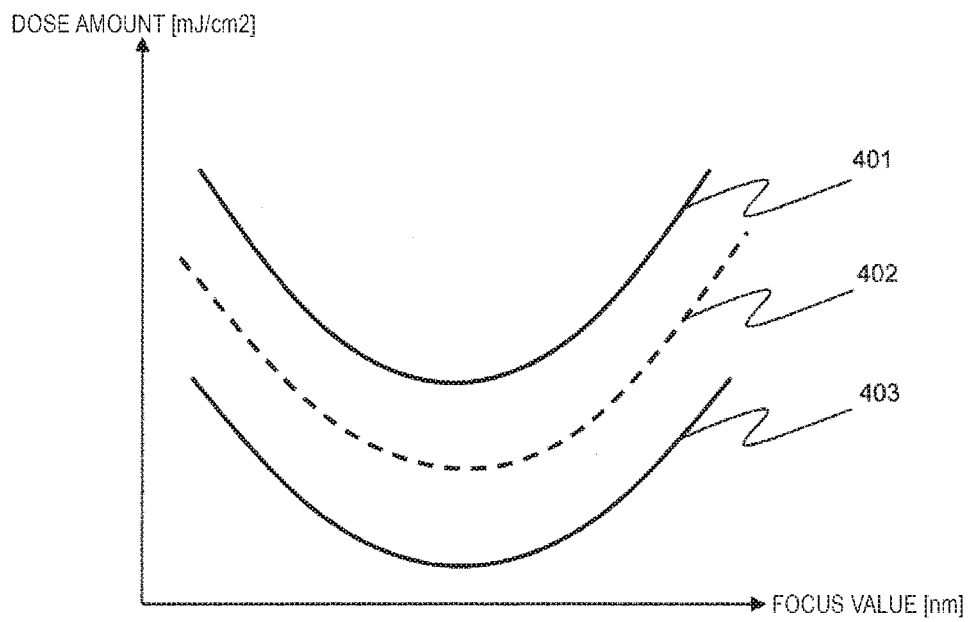
[Fig. 5]
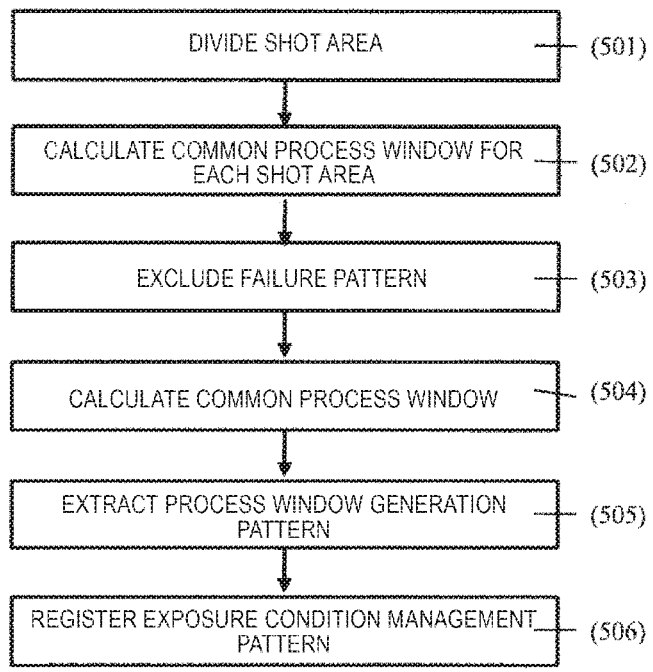

[Fig. 6]
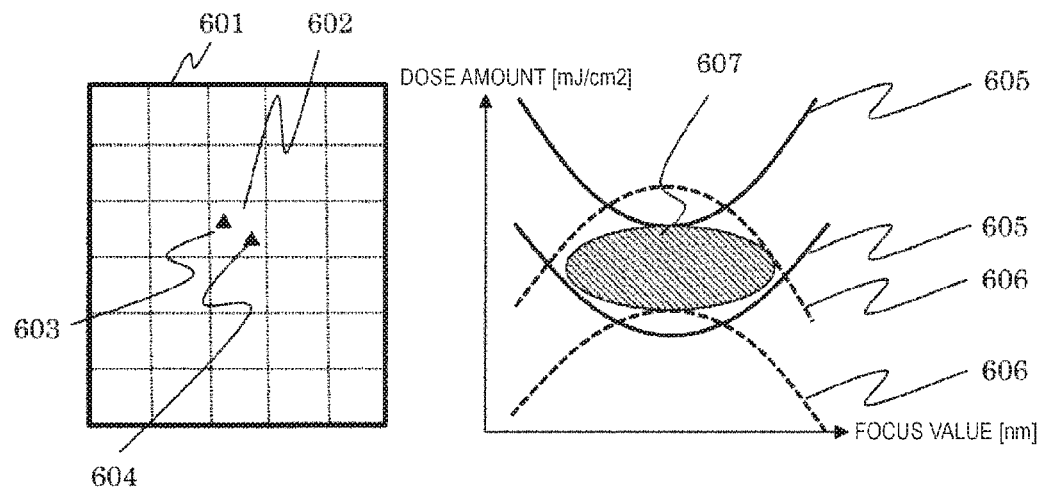
[Fig. 7]
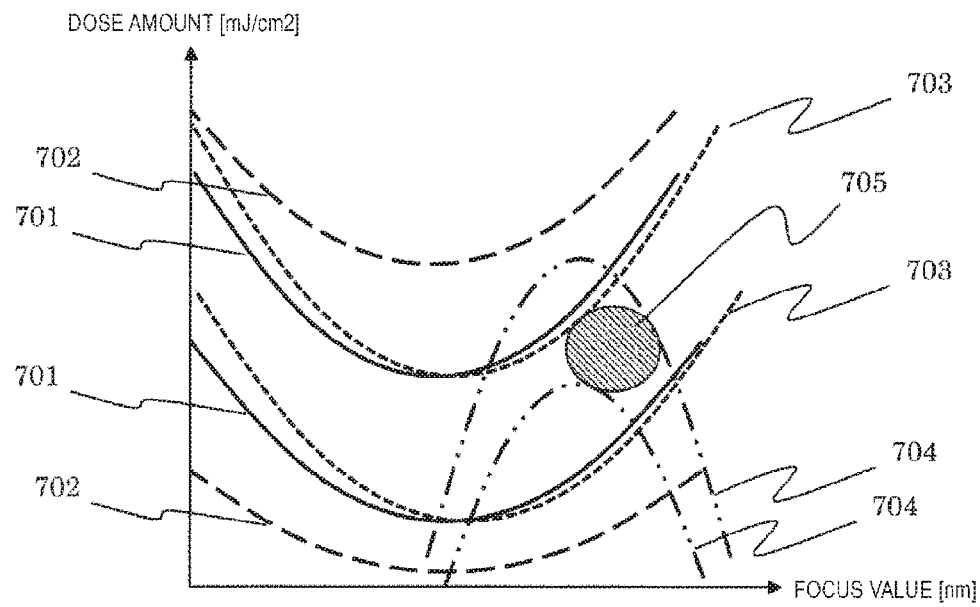

[Fig. 8]
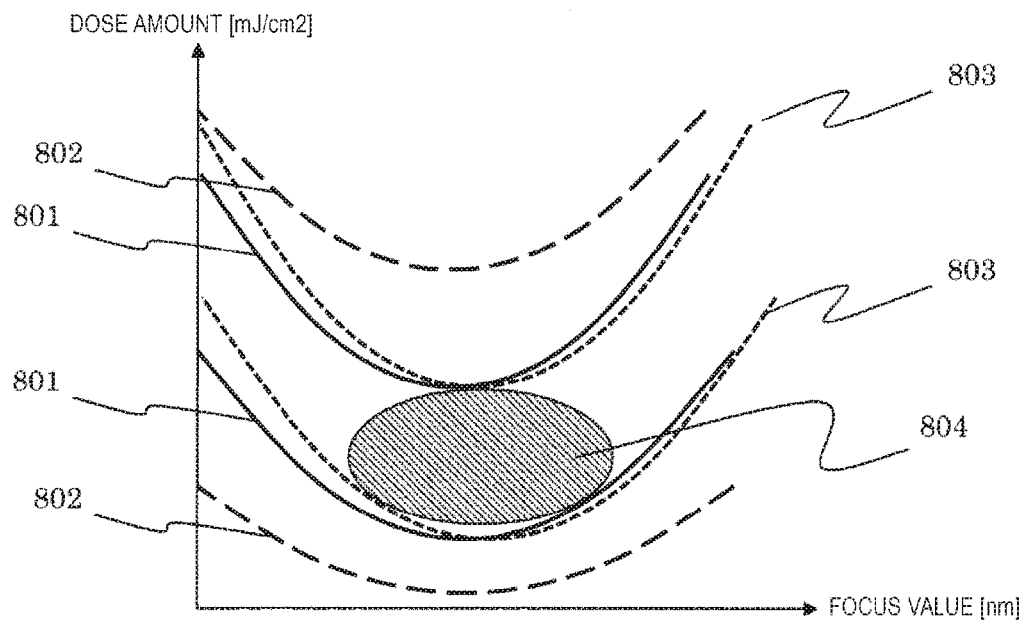
[Fig. 9]
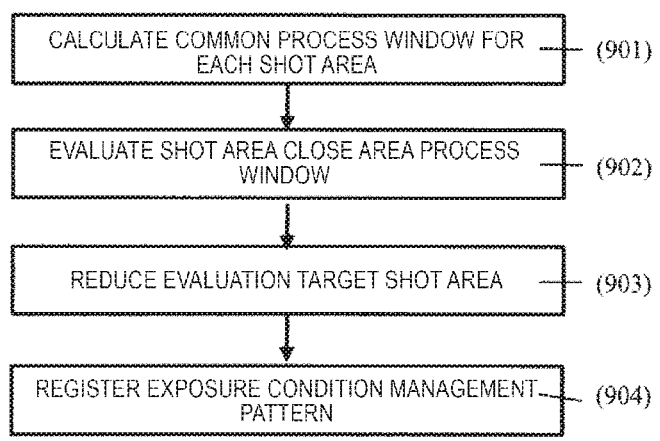

[Fig. 10]
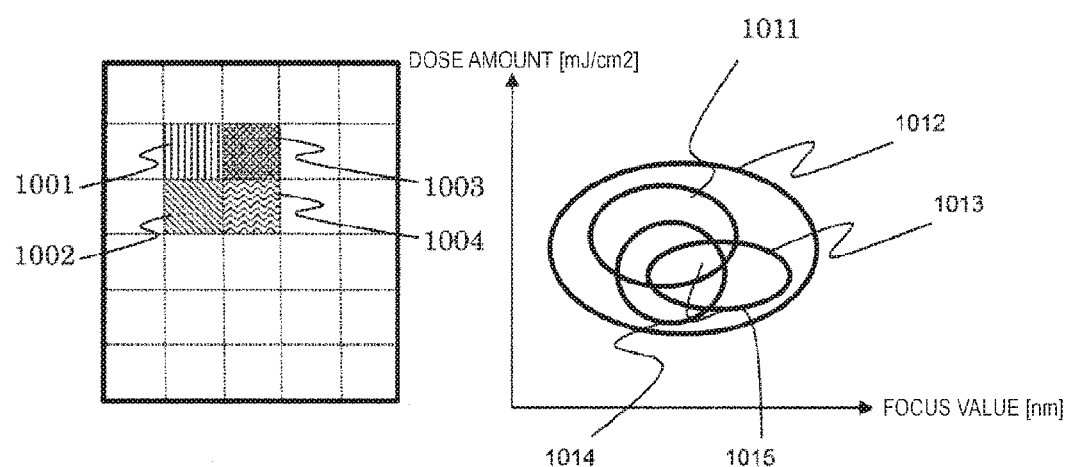

[Fig. 11]
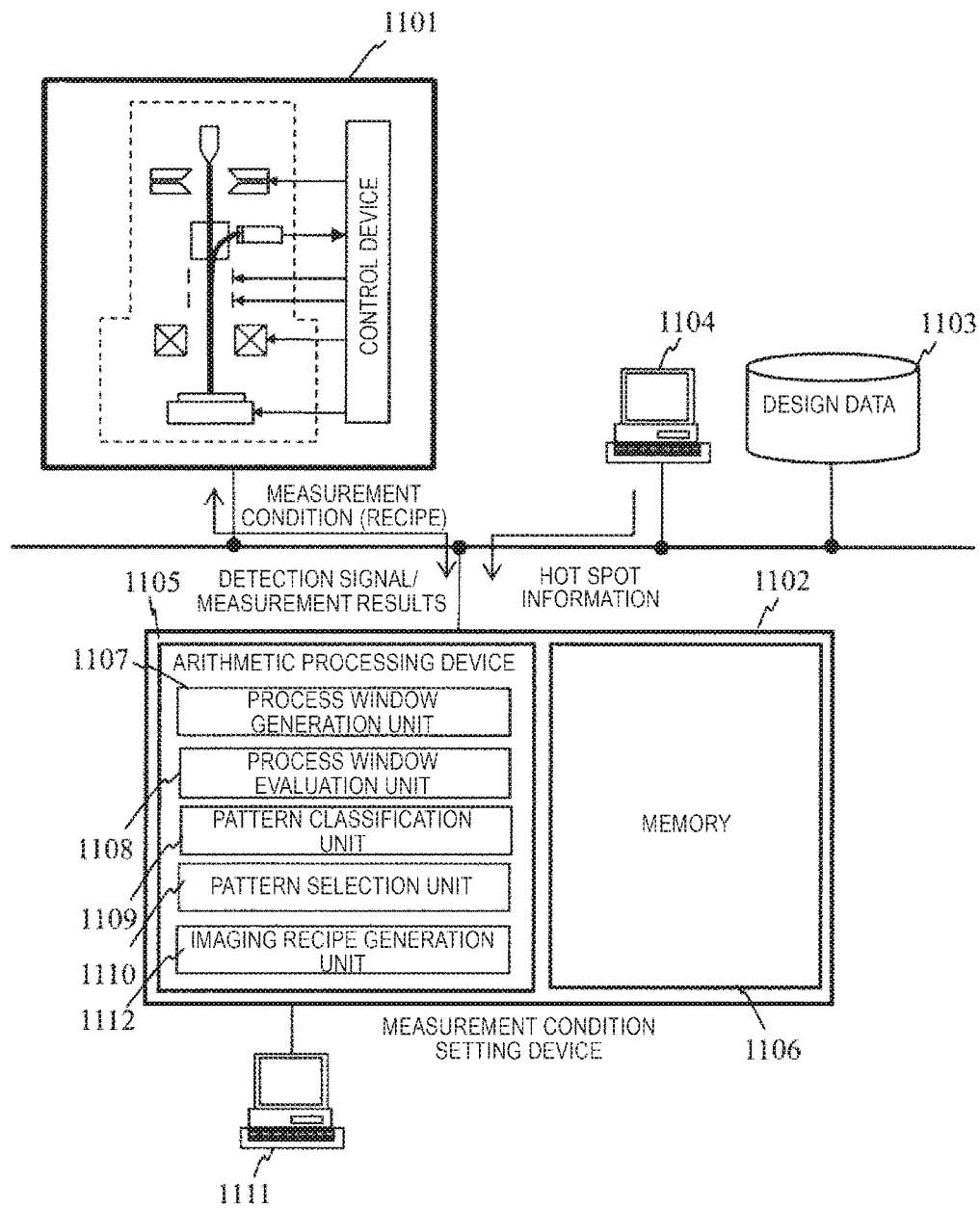

[Fig. 12]
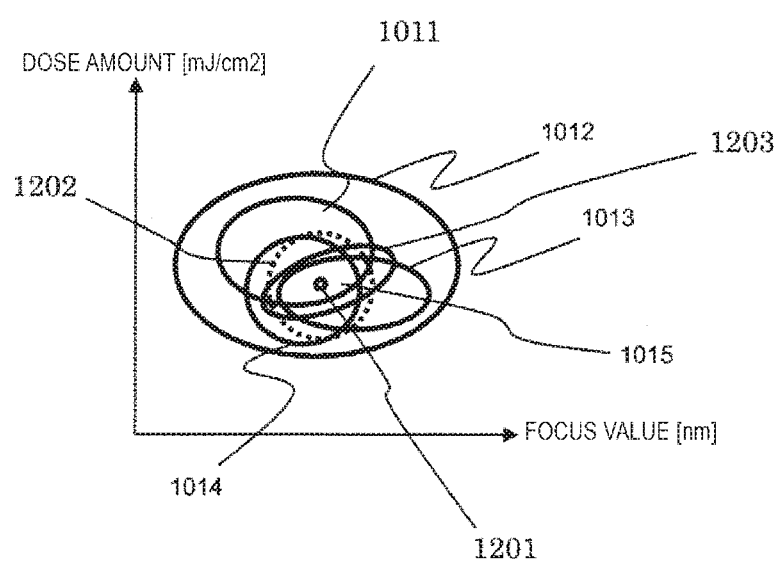

EVALUATION CONDITION SETTING METHOD OF SEMICONDUCTOR DEVICE, AND EVALUATION CONDITION SETTING APPARATUS

CLAIM OF PRIORITY

The present application claims priority from Japanese patent application JP 2015-151452 filed on Jul. 31, 2015, the content of which is hereby incorporated by reference into this application

TECHNICAL FIELD

The present invention relates to an evaluation condition setting method of a semiconductor device and an evaluation condition setting apparatus, and particularly to a setting method of setting evaluation conditions of a pattern which is generated based on exposure performed by a reduction projection exposure device or the like, and an apparatus.

BACKGROUND ART

In a lithography process which is a part of a process of generating a semiconductor circuit, a photosensitive lightring resist (hereinafter, referred to as "resist") is applied onto a substrate such as a semiconductor wafer, with a predetermined thickness, reduction exposure of a mask pattern is performed by using an exposure device, development thereof is performed, and thereby a resist pattern is generated. A shape of the generated pattern changes due to various process variations, and thus, the pattern is managed by measuring a dimension of the pattern using a scanning electron microscope (hereinafter, referred to as "length measuring SEM") with a dimension measurement function.

However, recently, a variation allowable amount of the pattern has been reduced in accordance with thinning and densification of a semiconductor device. Hence, simple dimension management is not sufficient, and it is necessary to manage variation of a focus value and an exposure amount of the exposure device which is a part of process variation factors, with high accuracy.

PTL 1 discloses a process window analyzing method of performing measurement or shape evaluation of a pattern size of each exposure condition, and calculating exposure conditions within a variation allowable range of a pattern, using a focus exposure matrix (FEM) wafer whose pattern is printed by changing the exposure conditions (focus, exposure amount) for each shot (exposure unit of one time), as a method of managing variation of the focus value and the exposure amount of the exposure device. By using the analyzing method, variation of the exposure conditions can be appropriately evaluated, and management of manufacturing conditions can be performed. In addition, PTL 2 proposes a method of extracting various feature amounts from a pattern shape of each exposure condition which is acquired by using the FEM wafer, generating an estimation model by using the feature amounts, and estimating exposure conditions of a management target pattern by using the extracted feature amounts extracted from the imaged management target pattern and the estimation model.

CITATION LIST

Patent Literature

PTL JP-A-2013-179105 (corresponding U.S. Patent Application Publication No. US2015/0012243)

PTL 2: JP-A-2005-286095 (corresponding U.S. Pat. No. 7,685,560)

SUMMARY OF INVENTION

Technical Problem

Meanwhile, in order to manage variation of exposure conditions of an exposure device, with higher accuracy, it is preferable that variation of exposure conditions of not only a shot basis, but also multiple portions within the shot is managed. The exposure device adjusts exposure conditions in arbitrary portions within the shot, and adjusts the exposure conditions of each portion so as to not exceed a variation allowable amount. Thus, variation of the pattern can be maintained within a predetermined range.

According to the methods disclosed in PTL 1 and PTL 2, evaluation of the patterns in various portions within the shot can be performed. However, performing of the evaluation in which adjustment of exposure conditions of each of multiple portions within the shot is assumed is not disclosed. In a case where setting of an evaluation point is performed by assuming that evaluation for adjusting the exposure conditions of each of the multiple portions within the shot is performed, if the evaluation point is set for each adjustable area, the number of the evaluation points becomes enormous. In addition, a case is considered in which the pattern is an original failure pattern and is classified as a correction target without being an evaluation target of a mass-production process. In order to realize both measurement efficiency and evaluation of an exposure device, with high accuracy, it is necessary to select an appropriate evaluation target pattern.

In addition, the method disclosed in PTL 2 is difficult to be applied to a case where a pattern having a feature amount necessary for generating an estimation model needs to be prepared in a predetermined portion within a shot and exposure condition management needs to be performed in a semiconductor wafer for products.

Hereinafter, an evaluation condition setting method of a semiconductor device and an evaluation condition setting apparatus with an object of selecting an appropriate evaluation pattern for exposure condition management with high accuracy will be described.

Solution to Problem

According to an aspect for solving the object, an evaluation condition setting method or an evaluation condition setting apparatus in which a pattern is selected which is a target of measurement that uses a charged particle beam, is proposed which excludes a pattern corresponding to a process window chart defining a process window range smaller than a predetermined process window range from a measurement target, in a plurality of the process window charts which are obtained based on scanning of a charged particle beam with respect to another pattern formed on a sample.

According to another aspect for solving the object, an evaluation condition setting method or an evaluation condition setting apparatus in which a pattern is selected which is a target of measurement that uses a charged particle beam, is proposed which extracts a common area that is included in a plurality of process window charts, and selects a pattern corresponding to a process window chart which forms the common area, or to a process window chart of a predetermined range which uses the common area as a reference, as a measurement target, in the plurality of process window charts which are obtained based on scanning of a charged particle beam with respect to another pattern formed on a sample.

Advantageous Effects of Invention

According to the configuration, an appropriate evaluation pattern for exposure condition sensing with high accuracy can be selected.

BRIEF DESCRIPTION OF DRAWINGS

FIG. 1 is a flowchart illustrating a flow of exposure condition management pattern selection processing.

FIG. 2 is a diagram illustrating a schematic configuration example of a scanning electron microscope.

FIG. 3 is a graph illustrating a relationship between a focus value of exposure or an amount of dose and a length measurement value.

FIG. 4 is an example of generating a process window chart.

FIG. 5 is a flowchart illustrating details of minimum pattern selection of each target area within a shot.

FIG. 6 is a diagram illustrating an example of calculation of a common process window in each shot area.

FIG. 7 is a diagram illustrating a process window chart including a failure pattern.

FIG. 8 is a diagram illustrating a process window chart including a pattern that does not contribute to common window generation.

FIG. 9 is a flowchart illustrating details of minimum pattern selection of each target area between the shots.

FIG. 10 is a diagram exemplifying multiple close shot areas included in one shot of an exposure device, and a process window of each close shot area.

FIG. 11 is a diagram illustrating an example of a configuration of a measurement system.

FIG. 12 is a diagram illustrating a method of selecting the close shot area or a pattern included in the close shot area, based on extraction of a common area of the close shot area.

DESCRIPTION OF EMBODIMENTS

In the embodiments which will be described below, an evaluation condition setting apparatus including an arithmetic device selecting a pattern which is a target of measurement that mainly uses a charged particle beam, in which the arithmetic device evaluates multiple process window charts which are obtained based on scanning of the charged particle beam with respect to another pattern formed on a sample, selects the process window chart defining a range smaller than a predetermined process window range (amount of worst variation), in the multiple process window charts, excludes a pattern corresponding to the selected process window chart from a measurement target, and selects a pattern which is the measurement target, will be described with reference to the drawings.

According to the embodiment which will be described below, a minimum required pattern group within a shot for managing variation of exposure conditions of an exposure device can be automatically selected by using a process window analyzing method, and process management with high accuracy can be performed by using this in the shortest time.

(1) Flow of Processing From Fabrication of Evaluation Wafer to Selection of Measurement Target Pattern FIG. 1 is a flowchart illustrating processing processes from fabrication of a wafer for exposure device evaluation (FEM wafer) to selection of a measurement target pattern. First, an arbitrary lithography process for generating a semiconductor circuit pattern for exposure condition management is determined, and an FEM wafer whose exposure conditions are changed in each shot is fabricated such that a process window can be calculated (101). Subsequently, a pattern candidate which is used for the exposure condition management is imaged in each shot (102). It is preferable that the pattern candidate which is selected in this step has a narrow pattern variation of an allowable amount from the entire semiconductor circuit pattern, that is, a hot spot pattern. Various methods for extracting the hot spot pattern are proposed, but, for example, a method of extracting a pattern with a large amount of variation with respect to a change of exposure conditions by performing an exposure simulation from design data of a semiconductor circuit, a method of extracting a pattern which can be defective due to variation of the exposure conditions by fabricating the FEM wafer and inspecting a process window periphery using a semiconductor defect inspecting device, or the like can be employed. Subsequently, dimension measurement of the pattern or measurement of a shape which is imaged in the process of 102 is performed (103). A SEM image such as a broken pattern is not suitable for process window chart calculation which will be described. Therefore, at this point of time, the SEM image with the broken pattern may be removed in advance. The measurement results of 103 are classified for each pattern and a process window chart is calculated (104).

An exposure device divides a shot area into adjustable units for high accuracy exposure condition management.

Minimum pattern selection required for the exposure condition management is performed by a shot area unit, using a process window chart calculated for each pattern involved in each shot area, as the pattern selection (105). Subsequently, minimum pattern selection required for the exposure condition management is performed in each area in the shot, using the minimum pattern selection results of the shot area unit and the process window chart selection results of each pattern (106). Selection of the minimum pattern required for the exposure condition management can be performed from among the exposure condition management pattern candidates selected at first by the flow.

(2) Configuration of Length Measuring SEM and Measurement System Including Length Measuring SEM Here, a configuration of a length measuring SEM and a device surrounding the length measuring SEM will be described.

In the following description, a charged particle beam device is exemplified as a device which acquires image data, and an example which uses a SEM as an aspect thereof will be described, but, for example, a focused ion beam (FIB) device which acquires an image by scanning an upper portion of a sample using an ion beam may he employed as the charged particle beam device. Since an extremely high magnification is required to measure a pattern whose miniaturization progresses with high accuracy, it is preferable that the SEM generally superior to the FIB device in terms of resolution is used.

FIG. 2 illustrates a schematic configuration example of the length measuring SEM which is used for an embodiment. An electronic beam 203 is emitted from an electronic source 201 by extracting electrode 202, and are accelerated by an acceleration electrode which is not illustrated. The accelerated electronic beam 203 is focused by a condenser lens 204 which is type of a focusing lens, and thereafter, is deflected by a scanning deflector 205. Thereby, the electronic beam 203 scans an upper portion of a sample 209 one-dimensionally or two-dimensionally. The electronic beam 203 incident on the sample 209 is accelerated by a negative voltage which is applied to an electrode embedded in a sample base 208, and is focused by a lens action of an objective lens 206 to be applied to a surface of the sample 209.

Electrons 210 (secondary electrons, back-scattering electrons, or the like) are emitted from a portion on the sample 209 which is irradiated with the beam. The emitted electrons 210 are accelerated in a direction of the electronic source 201 by an acceleration action based on a negative voltage which is applied to the electrode embedded in the sample base 208. The accelerated electrons 210 collide with a conversion electrode 212, and thereby secondary electrons 211 are generated. The secondary electrons 211 emitted from the conversion electrode 212 are captured by a detector 213, and an output I of the detector 213 is changed by an amount of the captured secondary electrons. Brightness of a display device which is not illustrated changes according to a change of the output I. For example, in a case where a second-dimensional image is formed, a deflection signal to the scanning deflector 205 is synchronized with the output I of the detector 213, and thereby an image of a scanning area is formed. An electronic detector 215 which detects secondary electrons 216 is disposed in the objective lens 206 in the scanning electron microscope of FIG. 2.

In a case where the configuration example of FIG. 2, an example in which the electrons 210 emitted from the sample 209 are converted into the secondary electrons 211 by the conversion electrode 212 once and thereby the secondary electrons are detected is provided, but the invention is not limited to this, and for example, a configuration in which an electronic magnification image tube or a detection surface of a detector is disposed on an orbit of the accelerated electrons may be employed.

Subsequently, a signal which is detected by the detector 213 is converted into a digital signal by an A/D converter 217, and is transmitted to an image processing unit 218.

The image processing unit 218 includes an image memory storage medium 220 for temporarily storing a digital image, and a CPU 219 which calculates a dimension feature quantity from an image of the image memory. The image processing unit further includes a storage medium 221 which stores measured values of each pattern or process window information. The entire control is performed by a workstation 222, and a necessary operation of devices, confirmation of detected results, or the like can be performed by a graphical user interface (hereinafter, referred to as GUI).

In addition, as will be described below, the workstation 222 functions as a measurement condition (evaluation condition) setting device which sets measurement conditions using a scanning electron microscope. More specifically, an imaging recipe of controlling the scanning electron microscope is generated, and at this time, a program (imaging recipe) is generated which automatically performs measurement with predetermined evaluation conditions by a predetermined portion, based on a measurement target portion (coordinates) or setting of optical conditions of the scanning electron microscope. In addition, the workstation 222 is configured to be connectable even to an external design data storage medium or a simulator, and has, for example, a function of selecting a measurement target portion, based on layout data which is read from design data, and a function of selecting a measurement target portion, based on hot spot information which is obtained by the simulator.

FIG. 11 is a diagram illustrating an example of a configuration of a measurement system in which a scanning electron microscope 1101 is coupled to a measurement condition setting device 1102 (corresponding to a workstation of FIG. 2) through a network. The system exemplified in FIG. 11 includes the SEM 1101, a design data storage medium 1103 which stores design data of a semiconductor device or layout data that is generated based on the design data, a simulator 1104 which performs a manufacturing simulation based on information stored in the design data storage medium 1103, and the measurement condition setting device 1102 which generates a recipe based on hot spot information that is outputted from the simulator 1104 or information stored in the design data storage medium 1103.

The measurement condition setting device 1102 is configured to be accessible to the scanning electron microscope 1101, the design data storage medium 1103, and the simulator 1104. In addition, an arithmetic processing device 1105 for generating a recipe, and a memory 1106 for storing necessary information are embedded in the measurement condition setting device 1102. The arithmetic processing device 1105 includes a process window generation unit 1107 which generates a process window based on exposure conditions of a reduction projection exposure device that is outputted from the design data storage medium 1103 and on measured results that is obtained by the scanning electron microscope 1101, a process window evaluation unit 1108 which evaluates a process window which is generated by the process window generation unit 1107, a pattern classification unit 1109 which classifies a pattern with a predetermined conditions or exposure conditions, based on evaluation results of the process window evaluation unit 1108, a pattern section unit 1110 which selects a pattern that becomes a measurement target, based on the evaluation results of the process window evaluation unit 1108, and an imaging recipe generation unit 1112 which generates an imaging recipe of the scanning electron microscope, based on input information of an input device 1111 or on pattern information selected by the pattern selection unit 1110.

(3) Method of Generating Process Window Chart

Here, a method of calculating a process window chart in "process window chart calculation" step (104) of FIG. 1 will be described.

A process window chart which is generated by the process window generation unit 1107 can clarify (visualize) a range of a focus value that satisfies a predetermined pattern variation allowable amount and arrange of a dose amount by using a graph. In generating the process window chart, measurement of a target pattern illustrated in step (103) of FIG. 1 is first performed. The measurement is performed with respect to a pattern which is generated by each exposure condition acquired from a FEM wafer for each target pattern acquired from the FEM wafer. For example, if the target pattern is a simple pattern such as a Line, a dimension measurement value which uses a line profile of the pattern which is a function of a length measuring SEM may be used as a measuring method. In addition, in a case where the target pattern includes a complicated shape, an amount of a change of the shape may be measured. A method disclosed in, for example, JP-A-10-312461 or JP-A-2009-190451 is applied to measurement for the amount of a change of the shape. According to the method, first, an outline is extracted with high accuracy from an acquired pattern, subsequently, a reference pattern is designated or generated, and finally, an interval between outline data of a measurement target and the reference pattern is measured.

If measurement of the target pattern ends, a graph illustrating a relationship between a focus value of exposure or a dose amount and a measured value is subsequently generated.

FIG. 3 illustrates an example of generating a graph showing a relationship between the focus value of exposure or the dose amount and a length measurement value. A black circle or the like of the graph indicates measured values for each shot. A line 305 for each dose amount of the FEM wafer corresponds to a line 301, and lines 306, 307, and 308 for each dose amount of the FEM wafer also respectively correspond to 302, 303, and 304 of the graph in the same manner as the line 305 for each dose amount. In addition, each of the measured values does not become an ideal value due to a pattern deformation according to process variation, roughness, or the like. The ideal value is a shape change amount corresponding to physical characteristics that are generally known. For example, in a case where the dose amount is the same and only the focus value changes, a shape evaluation value changes so as to be suitable for a quadratic curve. In addition, in a case where the focus value is the same and only the dose amount changes, the shape evaluation value changes so as to be suitable for linearity or logarithmic approximation curve (310). Something that is obtained by formalizing the relationship between the focus value and the dose amount is called a change amount model. By creating the change amount model, an arbitrary focus value and an ideal measured value with respect to the dose amount can be calculated even at an unmeasured portion.

FIG. 4 illustrates an example of generating the process window chart. The process window chart is generated by using a measurement maximum value and a measurement minimum value corresponding to the change amount model and the pattern variation allowable amount. By using the change amount model, a dose amount maximum value (401) is calculated from each focus value which satisfies the measurement maximum value, and a dose amount minimum value (403) is calculated from each focus value which satisfies the measurement minimum value. An area between the dose amount maximum value and the dose amount minimum value indicates the dose amount and the focus value which satisfy the variation allowable amount of the target pattern.

(4) Method of Selecting Minimum Pattern of Within Shot

Here, a step (105) of "selecting minimum pattern of each target area within shot" of FIG. 1 will be described.

FIG. 5 illustrates a detailed flow of a method of selecting the minimum pattern selection of each target area within the shot. First, a shot area is divided into areas with a size to be managed. If the division size is set small variation of exposure conditions in the shot can be managed in detail, but acquired data to be evaluated becomes enormous. Here, in a case where the variation of the exposure conditions exceeds an allowable range, an exposure device is corrected by using the calculated focus value and a shifted amount of the dose amount. Therefore, variation of the exposure conditions of an area smaller than an area which can be adjusted by the exposure device is not required to be managed, and thus, a minimum division size of the shot area may be set to an area which can be adjusted by the exposure device.

Subsequently, calculation of a common process window in each shot area is performed (502). The calculation of the common process window is performed by the process window evaluation unit 1108. In this step, the pattern candidate selected in (102) step of FIG. 1 for each divided shot area is first classified. For example, the pattern candidate included in a predetermined divided area 602 of a shot area 601 becomes two patterns 603 and 604. Subsequently, the common process window according to the classified pattern is calculated for each divided shot area. For example, 605 of FIG. 6 corresponds to a process window of a pattern 603, and 606 of FIG. 6 corresponds to a process window of a pattern 604. At this time, a maximum area which is represented by a rectangle or an ellipse of a common area that is illustrated by two process window charts becomes a common process window (607). After the common process window in each shot area is calculated, a failure pattern is excluded (503). For example, a common process window 705 is calculated from process window charts of four patterns of 701, 702, 703, and 704 illustrated in FIG. 7. In a case where the calculated common process window 705 is determined to be smaller than the amount of worst variation of the exposure device, a good pattern cannot be manufactured at an area thereof. Therefore, the process window chart 704 generated by a pattern which makes minimum process window is excluded, and the process window is calculated again. This processing is performed by the pattern classification unit 1109, and is repeated until common process phosphorous copper satisfies the amount of the worst variation of the exposure device. The excluded pattern is a failure and is classified as a modification target, and the rest of the patterns is registered as patterns for an exposure condition variation management.

After the entire failure patterns are excluded, calculation of the common process window is performed again (504). FIG. 8 illustrates calculated results of the common process window after the pattern generating the process window chart of 704 which is a failure pattern in FIG. 7 is excluded. In this step, the process window charts which are used for generating the common process window 804 become 801 and 803, and a process window chart 802 is excluded because it is not needed. Accordingly, the pattern selection unit 1110 extracts a minimum pattern necessary for exposure state management by extracting only a pattern which contributes to generation of the common process window (505). The extracted pattern is registered in a memory or a storage medium as a variation management pattern in an exposure state (506).

The imaging recipe generation unit 1112 automatically generates an imaging recipe, based on pattern information (coordinate information, pattern size information, or the like) which is extracted (selected) by the pattern selection unit 1110.

(5) Method of Selecting Minimum Pattern Between Target Areas in Shot

Here, a step (106) of "selecting a minimum pattern between target areas in a shot" of FIG. 1 will be described. In this processing, a minimum pattern in each shot area described above is selected, and thereafter a shot area necessary for evaluation of exposure condition variation management is further reduced.

FIG. 9 illustrates a detailed flow of a method of selecting a minimum pattern selection of each target area between shots. In addition, FIG. 10 exemplifies one shot area (left figure) of an exposure device which includes multiple close shot areas, and the common process window (right figure) of the multiple close shot areas.

First, the common process window in each shot area is calculated (901). Here, exposure conditions of adjacent shot areas are not largely shifted, and an amount of adjustment of the exposure device cannot be largely changed at adjacent areas, and thus, evaluation of the common process window is performed at the adjacent areas between shots (902). For example, it is assumed that common process windows of close shot areas 1001, 1002, 1003, and 1004 are respectively 1011, 1012, 1013, and 1014.

Subsequently, when the exposure conditions of the shot area 1001 are fixed, areas of the common process window areas 1012, 1013, and 1014 are reduced by taking into account exposure condition change ranges of other areas. The area 1002 having a common window which does not contribute to generation of a common area 1015 finally generated is excluded because the area is not required for exposure condition management. Reduction of an evaluation target shot area which performs evaluation in each area is performed (903). As a result of the reduction, the common process window areas 1011, 1013, and 1014 are selected, and the corresponding close shot areas 1011, 1013, and 1014 are selected as exposure condition management areas. The patterns involved in the exposure condition management areas calculated in this way are registered in a memory or a storage medium (904).

The imaging recipe generation unit 1112 automatically generates an imaging recipe which sets a measurement target candidate included in 1001, 1003, and 1004 as a selective measurement target, from among the close shot areas 1001, 1002, 1003, and 1004 which are included in the measurement target candidate pattern selected based on hot spot extraction or the like.

In the aforementioned description, an example in which a shot area which generates an outline of the common area 1015 is selectively set to an evaluation target shot is described, but for example, the process window generation unit 1107 may generate the common area 1015, and a close shot area corresponding to a common process window in a predetermined range from the common area 1015 may be set as an evaluation target. More specifically, after the common area 1015 is extracted, the center of the common area 1015 or the center of gravity (starting point 1201) is obtained, and a shot area corresponding to the common process window area included in an outline thereof is selected in a predetermined range 1202 which uses the starting point 1201 as a reference, as illustrated in FIG. 12. In a case of an example of FIG. 12, a common process window area 1203 is selected, and a pattern included in the area is also selected as a measurement target, in addition to the common process window areas 1011, 1013, and 1014 which generate the common area 1015.

By making arbitrary adjustment of the predetermined range 1202 possible, it is possible to perform setting of an appropriate measurement conditions in which measurement efficiency and measurement accuracy are compatible.

(6) Summarizing

As described above, according to the present embodiment, it is possible to automatically select a minimum required pattern group in a shot so as to manage variation of exposure conditions of an exposure device using a method of analyzing a process window.

(7) Another Embodiment

A measurement condition setting method described in the present specification is not limited to the aforementioned embodiments, and includes various modification examples. For example, the aforementioned embodiments are described in detail in partial embodiments, and are not required to employ the entire configurations or processing described above. In addition, other configurations or processing may be added to the aforementioned embodiments, or a part of the configuration or the processing of the embodiments may be omitted or replaced with others.

In addition, a part or entirety of the aforementioned configurations, functions, processing units, processing means, or the like may be configured by, for example, an integrated circuit or other hardware. In addition, the aforementioned configurations, functions, or the like may be realized by analyzing and executing a program whose functions are performed by a processor. That is, the aforementioned configurations, functions, or the like may be realized by software. Information on a program, a table, a file, or the like which performs each function can be stored in a storage device such as, a memory, a hard disk, or a solid state drive (SSD), or in a storage device such as, an IC card, an SD card, or a DVD.

In addition, a control line or an information line which is considered to be necessary for description is illustrated, and all the controls lines or the information lines necessary for products is not illustrated. Actually, it may be considered that approximately the entire configurations are coupled to each other.

REFERENCE SIGNS LIST

201 ELECTRONIC SOURCE
202 EXTRACTING ELECTRODE
203 ELECTRONIC BEAM
204 CONDENSER LENS
205 SCANNING DEFLECTOR
206 OBJECTIVE LENS
207 STAGE
208 SAMPLE BASE
209 SAMPLE
210 EMITTED ELECTRON
211 SECONDARY ELECTRON
212 CONVERSION ELECTRODE
213 DETECTOR
214 CONTROL DEVICE
215 ELECTRON DETECTOR
216 SECONDARY ELECTRON

The invention claimed is:

1. An evaluation condition setting method in which a pattern is selected which is a target of measurement that uses a charged particle beam, the method comprising:
acquiring signals obtained through scanning of a charged particle beam with respect to a plurality of different patterns that are included in a sample subjected to exposure with an exposure device for each of different combinations of focus conditions and dose conditions, the plurality of different patterns being candidate patterns for measurement using the charged particle beam;
computing length measurement values of the plurality of different patterns based on the signals;
generating a plurality of process window charts for the plurality of different patterns based on a focus condition and a dose condition under which the length measurement values are within a predetermined allowable range;
calculating a size of a common process window that is defined by the plurality of process window charts; and
excluding a pattern of the plurality of different patterns corresponding to a process window chart by which the size of the common process window becomes less than or equal to a predetermined value, and setting the plurality of different patterns other than the pattern as targets of measurement using the charged particle beam.

2. The evaluation condition setting method according to claim 1, wherein a size of the predetermined process window range is determined based on an amount of worst variation of an exposure device which is used for an exposure process for forming the pattern.

3. An evaluation condition setting apparatus comprising:
an arithmetic device selecting a pattern which is a target of measurement that uses a charged particle beam, the arithmetic device being configured to
acquire signals obtained through scanning of a charged particle beam with respect to a plurality of different patterns that are included in a sample subjected to exposure with an exposure device for each of different combinations of focus conditions and dose conditions, the plurality of different patterns being candidate patterns for measurement using the charged particle beam;
compute length measurement values of the plurality of different patterns based on the signals;
generate a plurality of process window charts for the plurality of different patterns based on a focus condition and a dose condition under which the length measurement values are within a predetermined allowable range;
calculate a size of a common process window that is defined by the plurality of process window charts; and
exclude a pattern of the plurality of different patterns corresponding to a process window chart by which the size of the common process window becomes less than or equal to a predetermined value, and set the plurality of different patterns other than the pattern as targets of measurement using the charged particle beam.

4. The evaluation condition setting apparatus according to claim 3, wherein a size of the predetermined process window range is determined based on the amount of worst variation of the exposure device which is used for an exposure process for forming the pattern.

5. The evaluation condition setting apparatus according to claim 3, wherein the arithmetic device generates a process window chart when exposure conditions change, based on measurement results of a pattern which is obtained at multiple locations in one shot of the exposure device.

6. An evaluation condition setting method in which a pattern is selected which is a target of measurement that uses a charged particle beam, the method comprising:
acquiring signals obtained through scanning of the charged particle beam with respect to a plurality of different patterns that are included in a sample subjected to exposure with an exposure device for each of a plurality of different combinations of focus conditions and dose conditions, the plurality of different patterns being candidate patterns for measurement using the charged particle beam;
computing length measurement values of the plurality of different patterns based on the signals;
generating a plurality of process window charts for the plurality of different patterns based on a focus condition and a dose condition under which the length measurement values are within a predetermined allowable range;
identifying a common process window that is defined by the plurality of process window charts; and
excluding a pattern corresponding to a process window chart that is away from the identified common process window, and setting the plurality of different patterns other than the pattern as targets of measurement using the charged particle beam.

7. An evaluation condition setting apparatus comprising:
an arithmetic device selecting a pattern which is a target of measurement that uses a charged particle beam, the arithmetic device being configured to
acquire signals obtained through scanning of the charged particle beam with respect to a plurality of different patterns that are included in a sample subjected to exposure with an exposure device for each of a plurality of different combinations of focus conditions and dose conditions, the plurality of different patterns being candidate patterns for measurement using the charged particle beam;
compute length measurement values of the plurality of different patterns based on the signals;
generate a plurality of process window charts for the plurality of different patterns based on a focus condition and a dose condition under which the length measurement values are within a predetermined allowable range;
identify a common process window that is defined by the plurality of process window charts; and
exclude a pattern corresponding to a process window chart that is away from the identified common process window, and set the plurality of different patterns other than the pattern as targets of measurement using the charged particle beam.

* * * * *